(12) United States Patent
Lee

(10) Patent No.: US 11,902,927 B2
(45) Date of Patent: Feb. 13, 2024

(54) APPARATUS AND METHOD FOR TIME SYNCHRONIZATION OF REPEATER

(71) Applicant: SK TELECOM CO., LTD., Seoul (KR)

(72) Inventor: Dae Young Lee, Seoul (KR)

(73) Assignee: SK Telecom Co., Ltd., Seoul (KR)

( * ) Notice: Subject to any disclaimer, the term of this patent is extended or adjusted under 35 U.S.C. 154(b) by 420 days.

(21) Appl. No.: 17/308,369

(22) Filed: May 5, 2021

(65) Prior Publication Data

US 2021/0258904 A1     Aug. 19, 2021

Related U.S. Application Data

(63) Continuation-in-part of application No. PCT/KR2020/006292, filed on May 13, 2020.

(30) Foreign Application Priority Data

Oct. 25, 2019   (KR) ........................ 10-2019-0133785

(51) Int. Cl.
*H04W 56/00* (2009.01)
*H04B 7/155* (2006.01)
*H04W 72/0446* (2023.01)

(52) U.S. Cl.
CPC ...... *H04W 56/005* (2013.01); *H04B 7/15507* (2013.01); *H04W 56/002* (2013.01); *H04W 72/0446* (2013.01)

(58) Field of Classification Search
CPC ............. H04W 56/005; H04W 56/002; H04W 72/0446; H04B 7/15507; H04B 7/155;
(Continued)

(56) References Cited

U.S. PATENT DOCUMENTS

2004/0208142 A1* 10/2004 Saw ..................... H04B 7/2681
                                                                                   370/328
2007/0189417 A1*  8/2007 Waheed .................. H03C 5/00
                                                                                   375/300
2008/0260388 A1* 10/2008 Kim ................. H04B 10/25753
                                                                                   398/115

FOREIGN PATENT DOCUMENTS

JP          6567438 B2     8/2019
KR   10-2005-0031005 A    4/2005
(Continued)

OTHER PUBLICATIONS

Korean Intellectual Property Office, Office Action, KR Patent Application No. 10-2019-0133785, dated Feb. 23, 2021, 15 pages.
(Continued)

*Primary Examiner* — Dady Chery
(74) *Attorney, Agent, or Firm* — WTA Patents

(57) ABSTRACT

An apparatus for time synchronization of a repeater according to an embodiment of the present disclosure includes a downlink receiver and a downlink transmitter establishing a downlink path for delivering a downlink signal, an uplink receiver and an uplink transmitter establishing an uplink path for delivering an uplink signal, a switch including an upper switch and a lower switch and performing switching such that the downlink path is established in a downlink interval and the uplink path is established in an uplink interval, a delay processor compensating for a time delay of one of the downlink signal and the uplink signal, and a synchronization controller controlling the switching of the switch in synchronization with the time delay of the compensated signal so that the uplink interval and the downlink interval do not overlap.

10 Claims, 8 Drawing Sheets

(58) Field of Classification Search
CPC ....... H03L 7/081; H03L 7/087; H03L 7/0814; H04L 7/033; H04L 7/0033
See application file for complete search history.

(56) References Cited

FOREIGN PATENT DOCUMENTS

| | | |
|---|---|---|
| KR | 10-2006-0036656 A | 5/2006 |
| KR | 10-2008-0041409 A | 5/2008 |
| KR | 10-2008-0054952 A | 6/2008 |
| KR | 10-2008-0057493 A | 6/2008 |
| KR | 10-0839635 B1 | 6/2008 |
| KR | 10-2012-0072040 A | 7/2012 |
| KR | 10-1490382 B1 | 2/2015 |
| KR | 10-1566295 B1 | 11/2015 |

OTHER PUBLICATIONS

European Patent Office, Extended European Search Report and Opinion, EP Patent Application No. 20879891.8, dated Jan. 11, 2022, 12 pages.

PCT International Search Report and Written Opinion, PCT Application No. PCT/KR2020/006292, dated Sep. 21, 2020, 11 pages.

\* cited by examiner

APPARATUS AND METHOD FOR TIME SYNCHRONIZATION OF REPEATER

CROSS-REFERENCE TO RELATED APPLICATIONS

This application is a continuation-in-part of International Patent Application No. PCT/KR2020/006292, filed on May 13, 2020, which claims the benefit of priority to Republic of Korea Patent Application No. 10-2019-0133785, filed on Oct. 25, 2019, which are incorporated by reference herein in their entirety.

TECHNICAL FIELD

The present disclosure relates to a time synchronization technology and, more particularly, to an apparatus and method for performing time synchronization to prevent oscillation due to coupling between signals in a repeater using a time division duplexing (TDD) scheme.

BACKGROUND ART

Repeaters are widely used in mobile communication systems such as LTE and WCDMA to cost-effectively increase coverage. Basically, a repeater is a device that receives a signal from the air through a donor antenna, adds minimal digital processing and analog gain, and radiates a resultant signal to a shaded area through a service antenna. This enables mobile communication services even in shaded areas. In Korea, repeaters are widely used to relieve shaded areas in underground parking lots, small and medium-sized buildings, and houses. A repeater employing the TDD scheme must precisely distinguish an uplink signal and a downlink signal in the time domain. However, as shown in the graph of FIG. 1A, there exists a section in which an uplink signal and a downlink signal overlap (up/down overlap). Therefore, as shown in FIG. 1B, when a signal received through the donor antenna and a signal radiated through the service antenna are coupled and thereby form positive feedback, the entire system may become unstable or oscillate, resulting in malfunction. This entire system oscillation radiates completely different oscillation signals in both a donor direction (toward a base station) and a service direction (toward a terminal), causing unnecessary radiation that makes it difficult for all of nearby mobile communication systems to operate normally. In order to minimize such oscillation, WCDMA and LTE manage uplink/downlink isolation values at the development stage and design the system so that re-radiated signals do not flow back into the repeater as much as possible. However, an expensive RF component is required to secure such isolation performance, and it is difficult to design the enclosure size to be small because respective antenna ports should be physically separated. Also, in order to minimize the oscillation phenomenon caused by such signal re-inflow, an interference cancellation system (ICS) wireless repeater implemented by adding a separate digital signal processing called interference cancellation is sometimes used. However, due to the added ICS function, this repeater has problems of great latency, high cost, and large size.

SUMMARY

An object of the present disclosure is to provide an apparatus and method for performing time synchronization to prevent oscillation due to coupling between signals in a repeater using a time division duplexing (TDD) scheme.

In order to accomplish the above object, an apparatus for time synchronization of a repeater according to an embodiment of the present disclosure includes an upper antenna, a lower antenna, a downlink receiver receiving a downlink signal from a base station through the upper antenna, a downlink transmitter transmitting a downlink signal to a user device through the lower antenna, an uplink receiver receiving an uplink signal from a user device through the lower antenna, an uplink transmitter transmitting an uplink signal to a base station through the upper antenna, an upper switch switching so that the upper antenna and the downlink receiver are connected in a downlink interval and the upper antenna and the uplink transmitter are connected in an uplink interval, a lower switch switching so that the lower antenna and the downlink transmitter are connected in the downlink interval and the lower antenna and the uplink receiver are connected in the uplink interval, a delay processor connected to the downlink receiver, the downlink transmitter, the uplink receiver, and the uplink transmitter to compensate for a time delay of any one of the downlink signal and the uplink signal, a gain processor amplifying the downlink signal or the uplink signal according to a gain, and a synchronization controller controlling switching of the upper switch and the lower switch in synchronization with the time delay of the compensated signal so that the uplink interval and the downlink interval do not overlap.

In order to accomplish the above object, an apparatus for time synchronization of a repeater according to an embodiment of the present disclosure includes a downlink receiver and a downlink transmitter establishing a downlink path for delivering a downlink signal, an uplink receiver and an uplink transmitter establishing an uplink path for delivering an uplink signal, a switch including an upper switch and a lower switch and performing switching such that the downlink path is established in a downlink interval and the uplink path is established in an uplink interval, a delay processor compensating for a time delay of one of the downlink signal and the uplink signal, and a synchronization controller controlling the switching of the switch in synchronization with the time delay of the compensated signal so that the uplink interval and the downlink interval do not overlap.

The delay processor includes a delay buffer delaying an input signal in accordance with an initialization control code and outputting the delayed signal, a delay measurer generating a delay code indicating a time delay of the input signal by comparing an output of each delay cell with a system clock, a control code generator generating a compensation control code for compensating for the time delay of the signal in accordance with the delay code, and a control code processor inputting the generated compensation control code to the delay buffer so that the time delay of the signal is compensated by the delay buffer in accordance with the compensation control code.

The delay buffer includes a plurality of delay cells connected in series, and each of the plurality of delay cells delays an input signal by same time and outputs the delayed signal.

The delay measurer includes a plurality of measurement cells corresponding to the plurality of delay cells, respectively, and generating the delay code by comparing an output of each of the plurality of delay cells with the system clock.

The apparatus further includes a gain processor generating and transmitting a test signal in an initialization mode.

When the synchronization controller controls the lower switch to connect the downlink transmitter and the uplink receiver and controls the upper switch to connect the uplink transmitter and the downlink receiver, the test signal is inputted to the delay processor through the downlink transmitter and the uplink receiver or is inputted to the delay processor through the uplink transmitter and the downlink receiver, and the delay processor performs initialization using the test signal.

The delay processor further includes a frequency divider, when the delay buffer delays an inputted test signal and outputs the delayed signal in the initialization mode, lowering a frequency of the signal outputted by the delay buffer by an integer multiple and outputting the frequency-lowered signal, and a phase frequency detector measuring a frequency and period of the system clock and a frequency and period of the output signal of the frequency divider. Here, the control code generator generates the initialization control code allowing the frequency and period of the output signal of the frequency divider to coincide with the frequency and period of the system clock, and the control code processor inputs the generated initialization control code to the delay buffer.

In order to accomplish the above object, an apparatus for time synchronization of a repeater according to an embodiment of the present disclosure includes a delay buffer delaying an input signal in accordance with an initialization control code and outputting the delayed signal, a delay measurer generating a delay code indicating a time delay of the input signal by comparing an output of each delay cell with a system clock, a control code generator generating a compensation control code for compensating for the time delay of the signal in accordance with the delay code, and a control code processor inputting the generated compensation control code to the delay buffer so that the time delay of the signal is compensated by the delay buffer in accordance with the compensation control code.

The delay buffer includes a plurality of delay cells connected in series, and each of the plurality of delay cells delays an input signal by same time and outputs the delayed signal.

The delay measurer includes a plurality of measurement cells corresponding to the plurality of delay cells, respectively, and generating the delay code by comparing an output of each of the plurality of delay cells with the system clock.

The apparatus further includes a frequency divider, when the delay buffer delays an inputted test signal and outputs the delayed signal in the initialization mode, lowering a frequency of the signal outputted by the delay buffer by an integer multiple and outputting the frequency-lowered signal, and a phase frequency detector measuring a frequency and period of the system clock and a frequency and period of the output signal of the frequency divider.

The control code generator generates the initialization control code allowing the frequency and period of the output signal of the frequency divider to coincide with the frequency and period of the system clock, and the control code processor inputs the generated initialization control code to the delay buffer.

In order to accomplish the above object, a method for time synchronization of a repeater according to an embodiment of the present disclosure includes, when one of a downlink signal and an uplink signal is inputted, at a delay processor, deriving a delay code indicating a time delay of the input signal by measuring the time delay of the input signal; at the delay processor, generating a compensation control code based on the delay code; at the delay processor, compensating for the time delay of the signal by using the compensation control code; and at a synchronization controller, controlling switching of a switch selectively establishing a downlink path or an uplink path in synchronization with the time delay of the compensated signal so that an uplink interval and a downlink interval do not overlap.

Deriving the delay code includes, at each of a plurality of delay cells connected in series in a delay buffer, delaying an input signal by same time and outputting the delayed signal; and at each of a plurality of measurement cells in a delay measurer corresponding to each delay cell, deriving the delay code by comparing an output of each delay cell with a system clock.

Generating the compensation control code includes, at a control code generator, generating the compensation control code for compensating for the time delay of the signal in accordance with the delay code.

Compensating for the time delay of the signal includes, at a control code processor, inputting the compensation control code to the delay buffer; and at each of a plurality of delay cells in a delay buffer, compensating for the time delay of an input signal in accordance with the compensation control code and outputting the compensated signal.

The method further includes, before deriving the delay code, at a synchronization controller, controlling a lower switch to connect a downlink transmitter and an uplink receiver, and controlling an upper switch to connect an uplink transmitter and a downlink receiver; at a gain processor, generating a test signal, and inputting the test signal to the delay processor through the downlink transmitter and the uplink receiver, or inputting the test signal to the delay processor through the uplink transmitter and the downlink receiver; and at the delay processor, performing initialization using the test signal.

Performing the initialization includes, at a delay buffer, delaying an inputted test signal and outputting the delayed signal; at a frequency divider, lowering a frequency of the outputted signal by an integer multiple and outputting the frequency-lowered signal; a phase frequency detector, measuring a frequency and period of a system clock and a frequency and period of the output signal of the frequency divider; and at a control code generator, generates the initialization control code allowing the frequency and period of the output signal of the frequency divider to coincide with the frequency and period of the system clock.

According to the present disclosure, through time synchronization of a repeater, it is possible to prevent oscillation due to positive feedback caused by overlap of an uplink signal and a downlink signal. This can optimize the time division duplexing (TDD) performance of the repeater. In particular, the present disclosure can be implemented through a relatively very simple digital logic circuit, so that the repeater can be drastically reduced in size while maintaining the overall performance. In addition, the present disclosure can accurately measure and compensate for a time delay without a high-speed clock, thereby reducing power consumption. Moreover, the present disclosure can measure and compensate for a time delay in real time, thereby maintaining optimal performance without being affected by environment such as temperature.

DETAILED DESCRIPTION

Figure 1A:
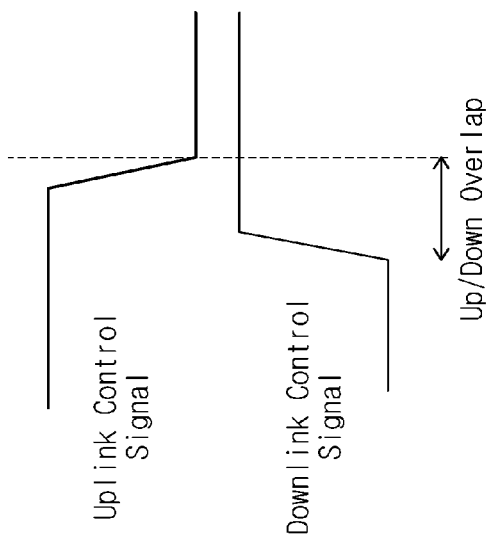
FIGS. 1A and 1B are diagrams illustrating a problem of a conventional wireless repeater using a TDD scheme.
Figure 1B:
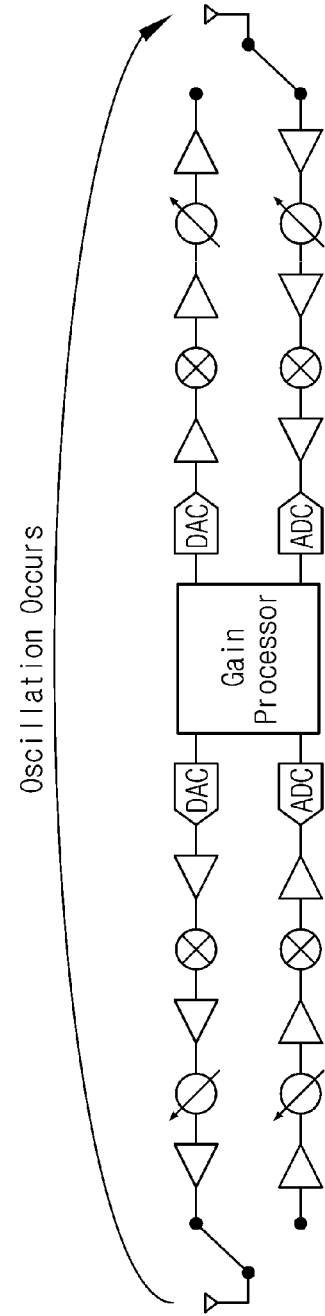

Hereinafter, embodiments of the present disclosure will be described in detail with reference to the accompanying drawings so that those of ordinary skill in the art to which the present disclosure pertains can easily implement the present disclosure. However, in the following description, well-known functions or configurations may not be described in detail to avoid obscuring the subject matter of the present disclosure. The embodiments described and illustrated herein are not intended to limit the technology disclosed in specific forms and should be understood to include various modifications, equivalents, and/or alternatives to corresponding embodiments.

In addition, when it is mentioned that a certain element is "connected to" or "coupled to" another element, it means that the element may be logically, electrically or physically connected to or coupled to another element. Namely, the element may be directly connected or coupled to another element, or a new element may exist between both elements.

Also, in this disclosure, the terms are merely used for describing particular embodiments but do not limit such embodiments. Singular forms are intended to include plural forms unless the context clearly indicates otherwise. Further, terms such as "comprise" or "include" used herein are intended to designate the presence of features, numbers, steps, operations, elements, components, or combinations thereof described herein, and do not preclude the possibility of the presence or addition of one or more other features, numbers, steps, operations, elements, components, or combinations thereof.

Now, embodiments of the present disclosure will be described in detail with reference to the drawings. The same reference numerals are used for elements having similar functions and operations throughout the drawings, and redundant descriptions thereof will be omitted. In addition, in order to avoid obscuring the subject matter of the present disclosure, well-known structures and devices may be omitted or shown in a block form centering on the core functions of each structure and device.

Figure 2:
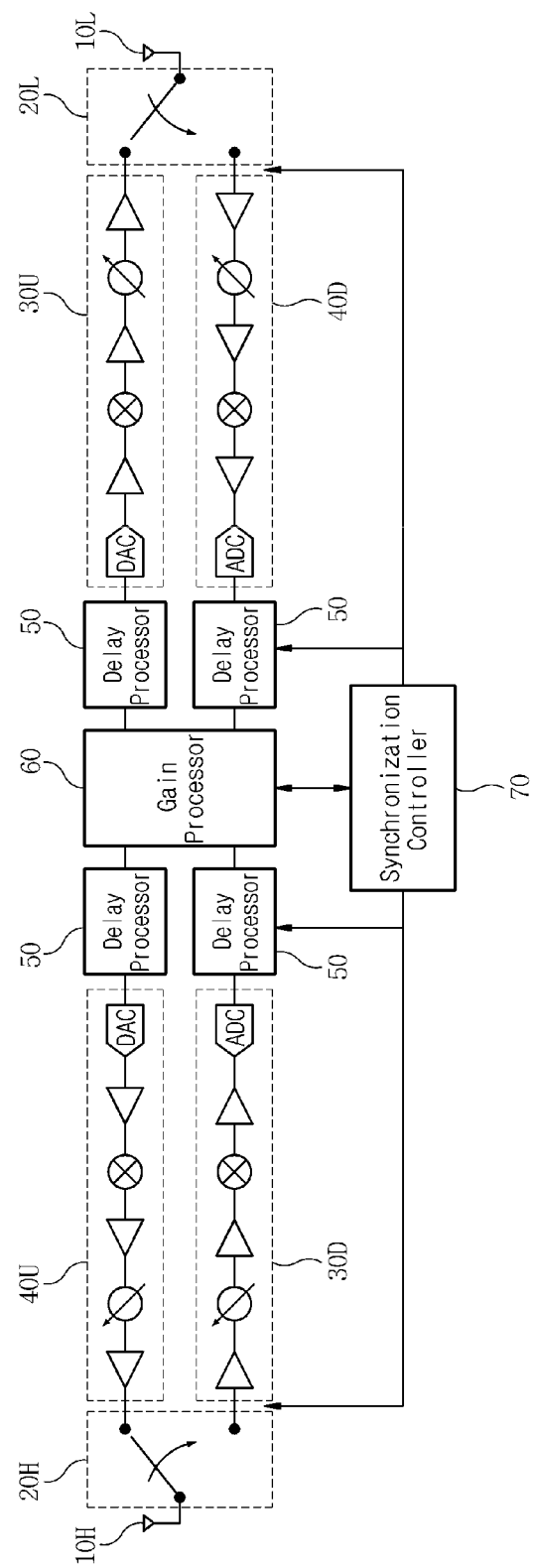
FIG. 2 is a diagram illustrating a configuration of a repeater according to an embodiment of the present disclosure.

First, a configuration of a repeater according to an embodiment of the present disclosure will be described. FIG. 2 is a diagram illustrating a configuration of a repeater according to an embodiment of the present disclosure.

Referring to FIG. 2, the repeater according to an embodiment of the present disclosure includes an upper antenna 10H, a lower antenna 10L, an upper switch 20H, a lower switch 20L, a downlink receiver 30D, a downlink transmitter 40D, an uplink receiver 30U, an uplink transmitter 40U, a delay processor 50, a gain processor 60, and a synchronization controller 70.

The upper antenna 10H (donor antenna) is an antenna for receiving a downlink signal from a base station (not shown) or transmitting an uplink signal to the base station.

The lower antenna 10L (service antenna) is an antenna for receiving an uplink signal from a user device (not shown) or transmitting a downlink signal to the user device.

Through switching, the upper switch 20H connects the upper antenna 10H and the downlink receiver 30D in a downlink interval of the time domain, and connects the upper antenna 10H and the uplink transmitter 40U in an uplink interval of the time domain.

Through switching, the lower switch 20L connects the lower antenna 10L and the uplink receiver 30U in the uplink interval of the time domain, and connects the lower antenna and the downlink transmitter 40D in the downlink interval of the time domain.

The downlink receiver 30D receives a downlink signal, which is a high-frequency analog signal received from the base station through the upper antenna 10H, down-converts the received signal to a baseband signal, converts the baseband signal into a digital signal, and outputs the baseband digital signal.

The downlink transmitter 40D converts a downlink signal, which is a baseband digital signal in which a gain is reflected by the gain processor 60, into an analog signal, up-converts the analog signal into a high-frequency signal, and then transmits the high-frequency downlink signal to the user device through the lower antenna 10L.

The uplink receiver 30U receives an uplink signal, which is a high-frequency analog signal received from the user device through the lower antenna 10L, down-converts the received signal to a baseband signal, converts the baseband signal into a digital signal, and outputs the baseband digital signal.

The uplink transmitter 40U converts an uplink signal, which is a baseband digital signal in which a gain is reflected by the gain processor 60, into an analog signal, up-converts the analog signal into a high-frequency signal, and then transmits the high-frequency uplink signal to the base station through the upper antenna 10U.

The delay processor 50 is configured to measure and compensate for a time delay caused by at least one of the downlink receiver 30D, the downlink transmitter 40D, the uplink receiver 30U, the uplink transmitter 40U, and the gain processor 60. The delay processor 50 will be described in detail below.

The gain processor 60 is configured to compensate for a gain of a downlink signal or an uplink signal, which is a digital signal.

The synchronization controller 70 acquires time synchronization through time delay compensation in the uplink and downlink intervals, and then controls switching (ON/OFF) of the upper switch 20H and the lower switch 20L so that the uplink and downlink intervals do not overlap.

Figure 3:
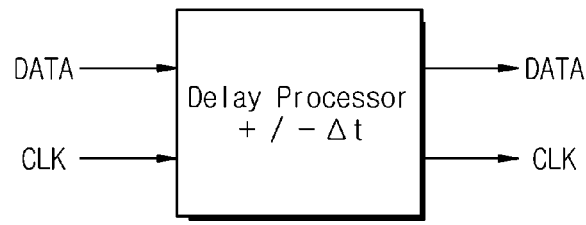
FIG. 3 is a diagram illustrating an operation of a delay processor according to an embodiment of the present disclosure.
Figure 4:
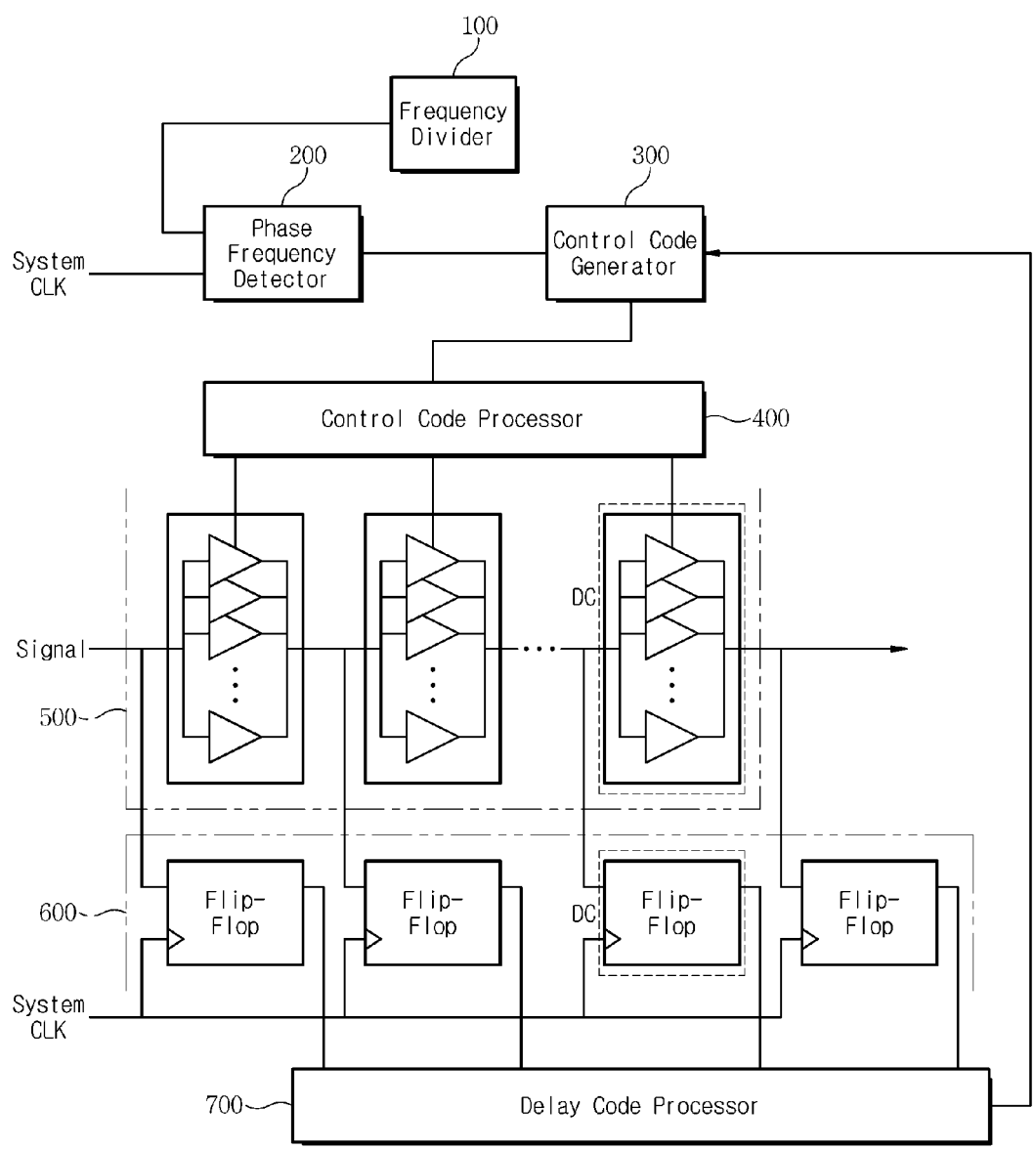
FIG. 4 is a diagram illustrating a configuration of a delay processor according to an embodiment of the present disclosure.

Next, the delay processor 50 according to an embodiment of the present disclosure will be described in detail. FIG. 3 is a diagram illustrating an operation of a delay processor according to an embodiment of the present disclosure. FIG. 4 is a diagram illustrating a configuration of a delay processor according to an embodiment of the present disclosure.

Referring to FIG. 3, the delay processor 50 receives clock (CLK) and data (DATA), compensates for a time delay by Δt, and then outputs clock (CLK) and data (DATA). Therefore, through a converter (ADC/DAC) receiving them, the time delay of the entire radio path (RF path) can be maintained as much as Δt. In particular, because the delay processor 50 continuously measures the time delay and performs corresponding compensation, it is possible to prevent oscillation of the repeater.

Hereinafter, the detailed configuration of the delay processor 50 will be described. Referring to FIG. 4, the delay processor 50 includes a frequency divider 100, a phase frequency detector 200, a control code generator 300, a control code processor 400, a delay buffer 500, a delay measurer 600, and a delay code processor 700.

The frequency divider 100 lowers (1/D) the frequency of an input signal by an integer multiple and outputs it. In particular, the frequency divider 100 receives an output signal of the delay buffer 500 in an initialization mode, lowers (1/D) the frequency of the received signal by an integer multiple, and outputs it. The delay processor 50 is configured to match a time delay with 1/D times a clock (system clock) period. To this end, the delay processor 50 uses a control code that makes the period slower by an integer (D) through the frequency divider 100 and compares it with a clock (system clock) to match. Therefore, by setting and adjusting the integer D (i.e., a denominator value in the frequency divider 100) during circuit design, the time delay of a desired resolution can be measured and compensated. For example, if a system clock of 100 MHz is used and a resolution of 1 ns is desired, the integer D of the frequency divider 100 may be set to 10 to make the period ⅒ times.

The phase frequency detector 200 measures the frequency and period of an input signal. In particular, the phase frequency detector 200 receives a system clock and an input signal from the frequency divider 100, and outputs a difference in frequency and period between the system clock and the input signal.

The control code generator 300 generates a control code for controlling a time delay of each of a plurality of delay cells (DCs) in the delay buffer 500. This control code is a digital code and includes an initialization control code and a compensation control code. The control code generator 300 generates the initialization control code that controls the entire time delay of the plurality of delay cells (DCs) in the delay buffer 500 to coincide with 1/D times the system clock period in the initialization mode. In addition, the control code generator 300 generates the compensation control code that compensates for a time delay of the input signal compared to the system clock in the delay buffer 500 in the compensation mode. The compensation control code is generated by applying inverse calculation to a delay code received from the delay code processor 700.

The delay buffer 500 delays an input signal in accordance with a control code and outputs it. The delay buffer 500 includes a plurality of delay cells (DCs). The plurality of delay cells (DCs) are connected in series, and each of the plurality of delay cells (DCs) delays the input signal in accordance with the control code. All of the plurality of delay cells DC may have the same time delay.

The delay measurer 600 measures the time delay of each delay cell (DC) by comparing the system clock with an output signal of each delay cell (DC) of the delay buffer 500 in the measurement mode, and outputs such time delays as a delay code, which is a digital code. In particular, the delay measurer 600 includes a plurality of measurement cells (MCs). Each of the measurement cells (MCs) may be formed of a flip-flop. Each of the plurality of measurement cells (MCs) compares the output of a corresponding one of the plurality of delay cells (DCs) with the system clock, and outputs a time delay value corresponding to a difference thereof.

The delay code processor 700 stores the delay code generated by the delay measurer 600 in the measurement mode, and provides the delay code stored in the compensation mode to the control code generator 300.

The above-described delay processor 50 according to an embodiment of the present disclosure is capable of accurately measuring and compensating for a time delay while using a system clock of less than 100 MHz in a field programmable gate array (FPGA)/application specific integrated circuit (ASIC) digital system. That is, the delay processor 50 is capable of measuring a time delay corresponding to an integer (D) times the system clock, storing it as a digital code value, and inverse-calculating the value in a corresponding signal to compensate.

Figure 5:
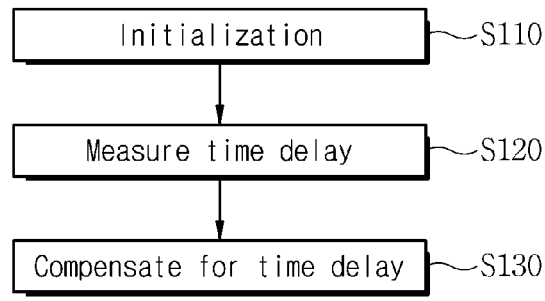
FIG. 5 is a flow diagram illustrating a method of compensating for a time delay at a delay processor according to an embodiment of the present disclosure.
Figure 6:
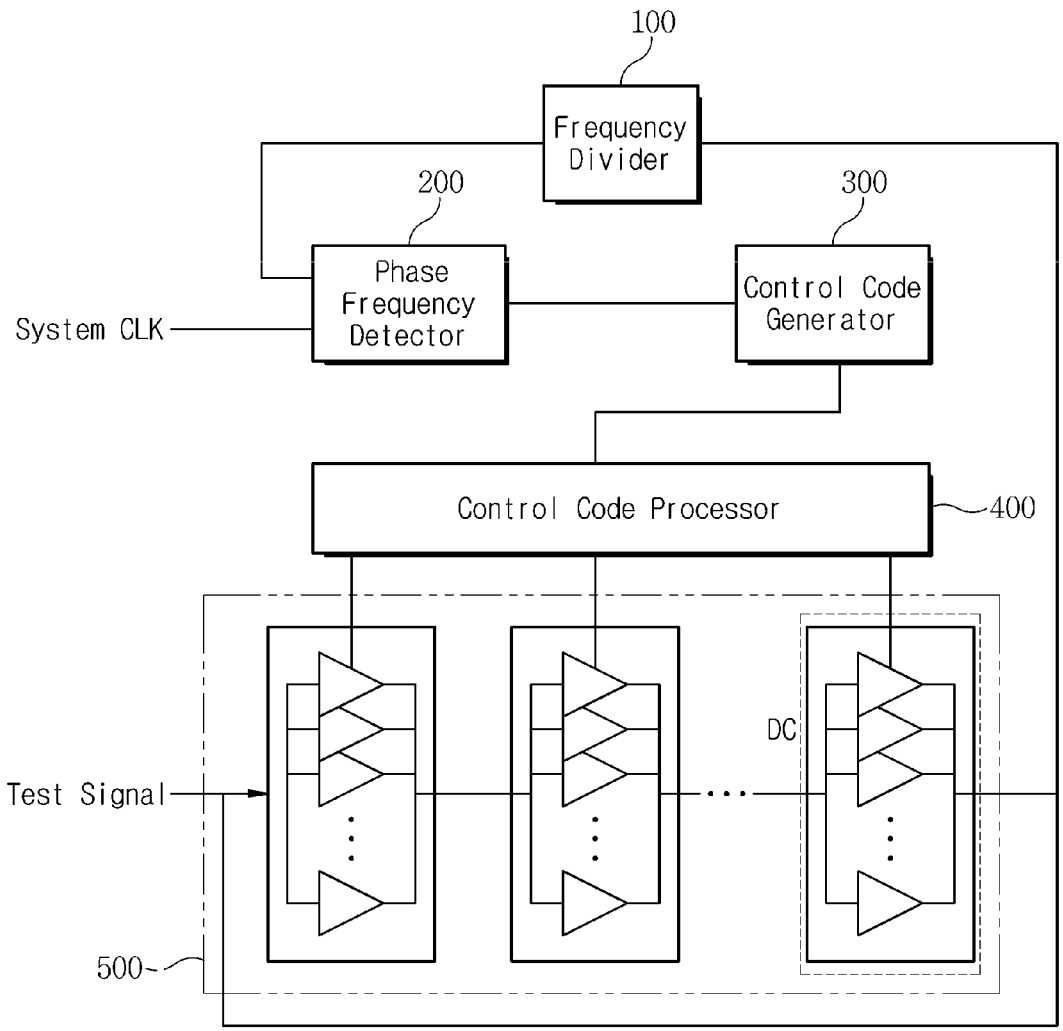
FIG. 6 is a diagram illustrating an operation of a delay processor in an initialization mode for performing initialization according to an embodiment of the present disclosure.
Figure 7:
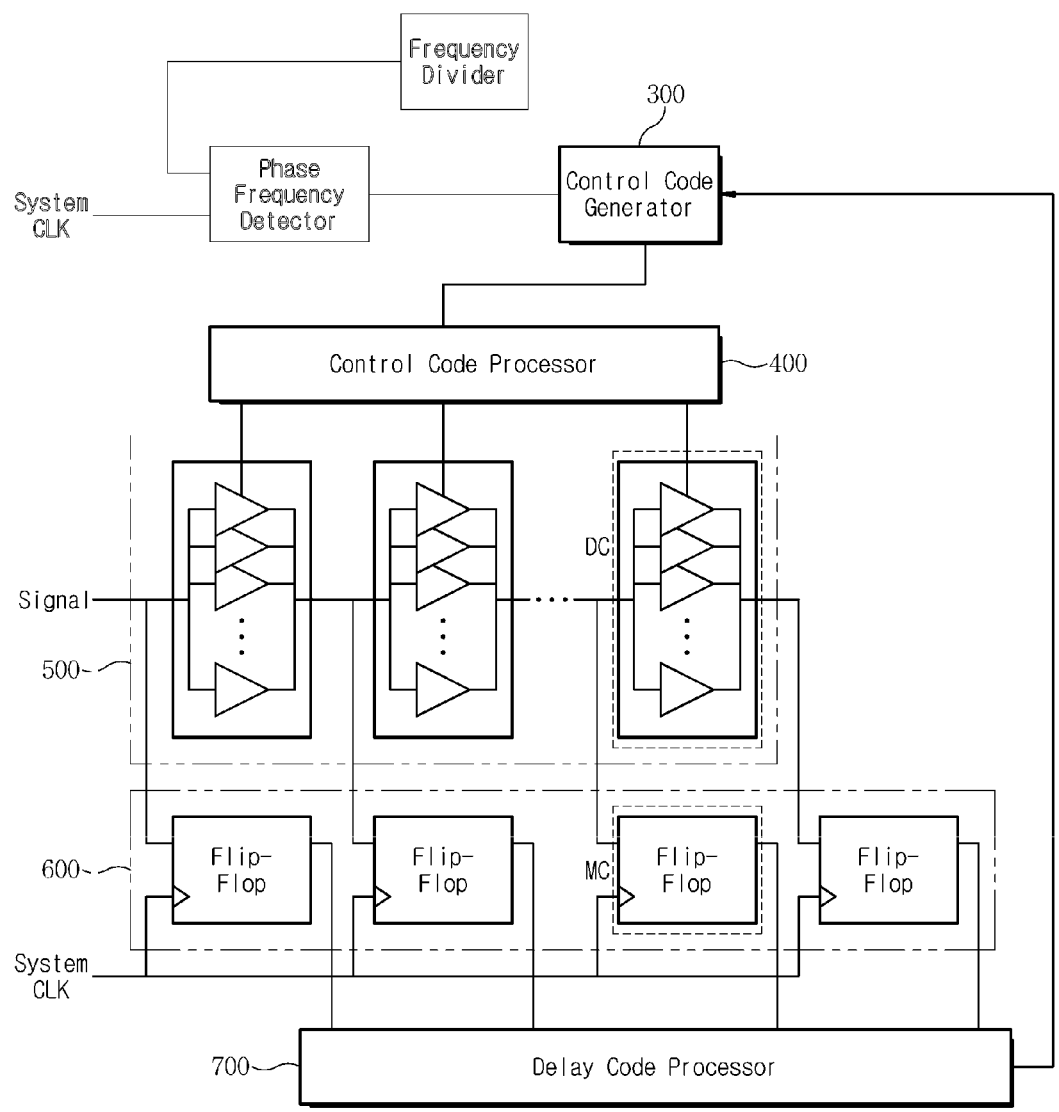
FIG. 7 is a diagram illustrating an operation of a delay processor in a measurement mode for measuring a time delay according to an embodiment of the present disclosure.
Figure 8:
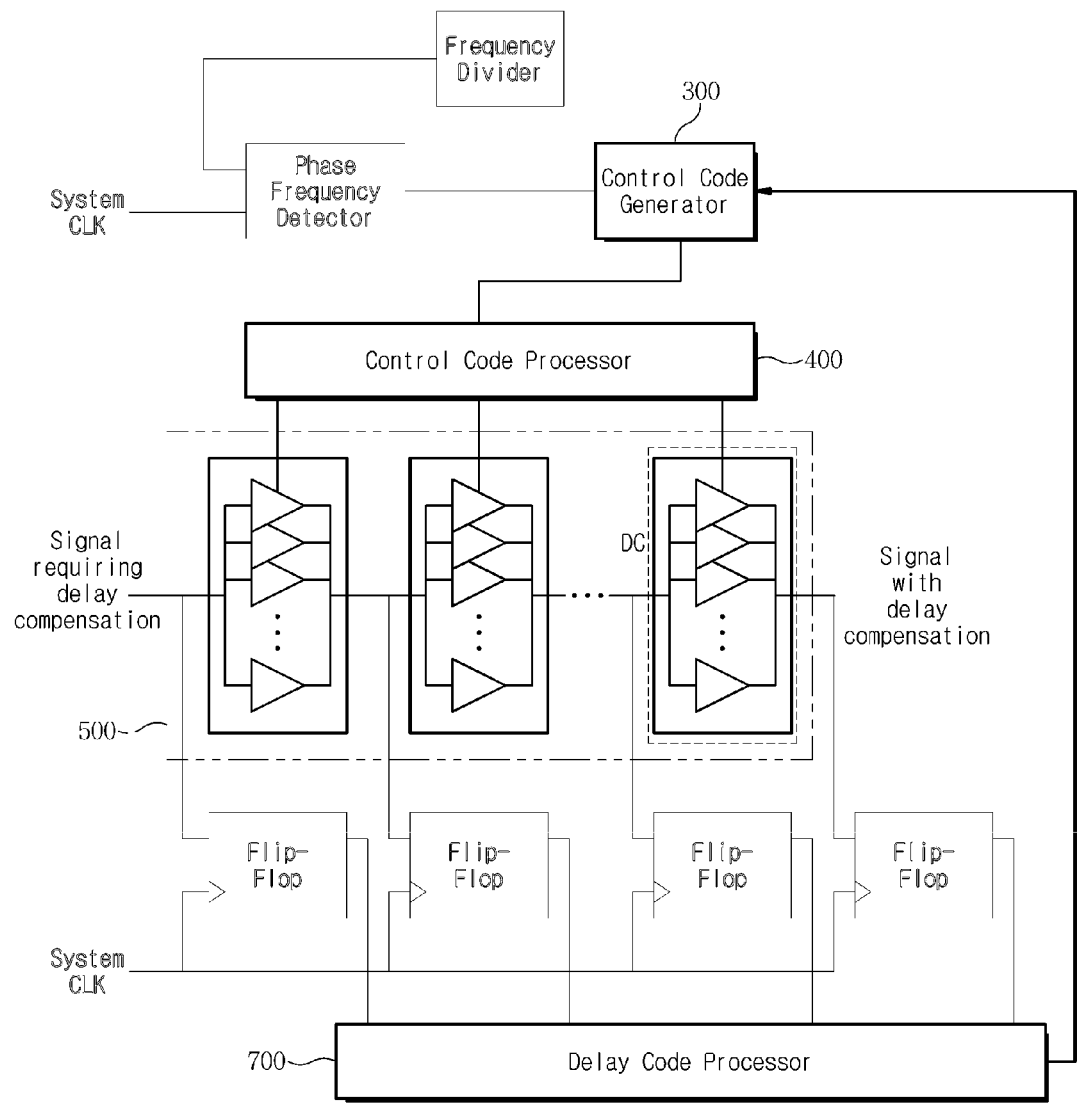
FIG. 8 is a diagram illustrating an operation of a delay processor in a compensation mode for compensating for a time delay according to an embodiment of the present disclosure.

Next, the operation of the delay processor 50 will be described in detail. FIG. 5 is a flow diagram illustrating a method of compensating for a time delay at a delay processor according to an embodiment of the present disclosure. FIG. 6 is a diagram illustrating an operation of a delay processor in an initialization mode for performing initialization according to an embodiment of the present disclosure. FIG. 7 is a diagram illustrating an operation of a delay processor in a measurement mode for measuring a time delay according to an embodiment of the present disclosure. FIG. 8 is a diagram illustrating an operation of a delay processor in a compensation mode for compensating for a time delay according to an embodiment of the present disclosure.

Referring to FIG. 5, the delay processor 50 performs initialization at step S110. For the operation of the delay processor 50, an operation of calibrating each of the plurality of delay cells (DCs) in the delay buffer 500, based on a system clock, is required. In this initialization mode, the delay processor 50 generates an initialization control code that controls the sum of time delays of all the delay cells (DCs) in the delay buffer 500 to be 1/D times the system clock period, and the control code processor 400 stores the generated initialization code.

Hereinafter, the initialization will be described in more detail with reference to FIG. 6. For initialization, the delay processor 50 has connection as shown in FIG. 6. That is, the output of the delay buffer 500 is inputted to the frequency divider 100, and the output of the frequency divider 100 is inputted to the phase frequency detector 200. Further, the phase frequency detector 200 receives the system clock together with the output of the frequency divider 100, and the output of the phase frequency detector 200 is inputted to the control code generator 300. In addition, the delay measurer 600 and the delay code processor 700 are deactivated.

In a state of connection as shown in FIG. 6, when a signal for initialization is inputted to the delay buffer 500, the delay buffer 500 delays the input signal and outputs it. The signal outputted from the delay buffer 500 is inputted to the frequency divider 100. Then, the frequency divider 100 makes the input signal D times slower and outputs it.

The phase frequency detector 200 receives a system clock and a signal outputted from the frequency divider 100, and measures the frequency and period of the system clock and the frequency and period of the output signal of the frequency divider 100. In addition, the phase frequency detector 200 outputs a difference in frequency and period between the system clock and the output signal of the frequency divider 100.

The control code generator 300 receives the difference in frequency and period between the system clock and the output signal of the frequency divider 100, and generates an initialization control code that is a digital code that makes the difference become zero. The generated initialization control code is capable of controlling a time delay of each delay cell (DC) in the delay buffer 500 so that the frequency and period of the output signal of the frequency divider 100 coincide with the frequency and period of the system clock. This initialization control code is a signal for controlling time delays of all the delay cells (DCs) in the delay buffer 500. A process of inputting and outputting a signal to and from one delay cell (DC) is referred to as one stage, and the delay buffer 500 generates the same time delay per stage through a control code. Therefore, through the above-described initialization, the control code generator 300 generates the initialization control code that matches the time delay of all stages caused by a plurality of delay cells (DCs) with 1/D times the system clock period. The control code processor 400 stores the initialization control code generated by the control code generator 300.

When the initialization is completed, the delay processor 50 performs at step S120 a measurement mode that measures a time delay of an input signal and thereby generates a delay code. That is, in the measurement mode, the delay processor 50 measures the time delay of the input signal by comparing the signal inputted to the delay buffer 500 having the time delay by the initialization control code with the system clock, and generates the delay code, which is a digital code, according to the measured time delay.

Hereinafter, the measurement mode will be described in more detail with reference to FIG. 7. For time delay measurement of a signal, the delay processor 50 has connection as shown in FIG. 7. That is, the output of the control code generator 300 is inputted to the control code processor 400, and the output of the control code processor 400 is inputted to the delay buffer 500. In addition, the output of the delay buffer 500 is inputted to the delay measurer 600, and the output of the delay measurer 600 is inputted to the delay code processor 700. In this case, the frequency divider 100 and the phase frequency detector 200 are deactivated.

In a state of connection as shown in FIG. 7, a signal for which time delay measurement is required is inputted to the delay buffer 500. Then, the plurality of delay cells (DCs) in the delay buffer 500 each outputs the input signal with the time delay according to the initialization control code. The output of each delay cell (DC) in the delay buffer 500 is inputted to a corresponding one of a plurality of measurement cells (MCs) in the delay measurer 600. Then, each measurement cell (MC) in the delay measurer 600 generates and outputs a delay code that indicates how much the output signal of each delay cell (DC) in the delay buffer 500 is delayed based on a rising edge of the system clock. The number of bits of this delay code is equal to the number of stages of the delay cells (DCs). The delay code is a digital code, and the delay code processor 700 stores this delay code.

After the time delay measurement is completed and the delay code is generated, the delay processor 50 performs at step S130 a compensation mode for compensating for the time delay of the input signal and then outputting it. That is, the delay processor 50 generates a control code for compensating for the signal time delay through the delay code in the compensation mode and inputs it to the delay buffer 500, thereby controlling the delay buffer 500 to compensate for the time delay of the input signal.

Hereinafter, the compensation mode will be described in more detail with reference to FIG. 8. In order to compensate for the time delay of the signal, the delay processor 50 has connection as shown in FIG. 8. That is, the output of the delay code processor 700 is inputted to the control code generator 300, and the output of the control code generator 300 is inputted to the control code processor 400. In addition, the output of the control code processor 400 is inputted to the delay buffer 500. In this case, the frequency divider 100, the phase frequency detector 200, and the delay measurer 600 are deactivated.

In a state of connection as shown in FIG. 8, the delay code processor 700 inputs the delay code to the control code generator 300. Then, the control code generator 300 generates a compensation control code by applying the inputted delay code as it is. In addition, the control code processor 400 receives the compensation control code and inputs it to the delay buffer 500. As such, because the compensation control code corresponding to the measured time delay is applied, when a signal is inputted, the delay buffer 500 outputs a signal in which the time delay is compensated by the measured amount with respect to the input signal.

As described above, according to the present disclosure, the delay processor 50 can accurately measure the time delay and compensate for this. Therefore, the delay processor 50 according to the present disclosure can precisely compensate for the time delay as to the uplink and downlink radio paths (RF paths).

Figure 9:
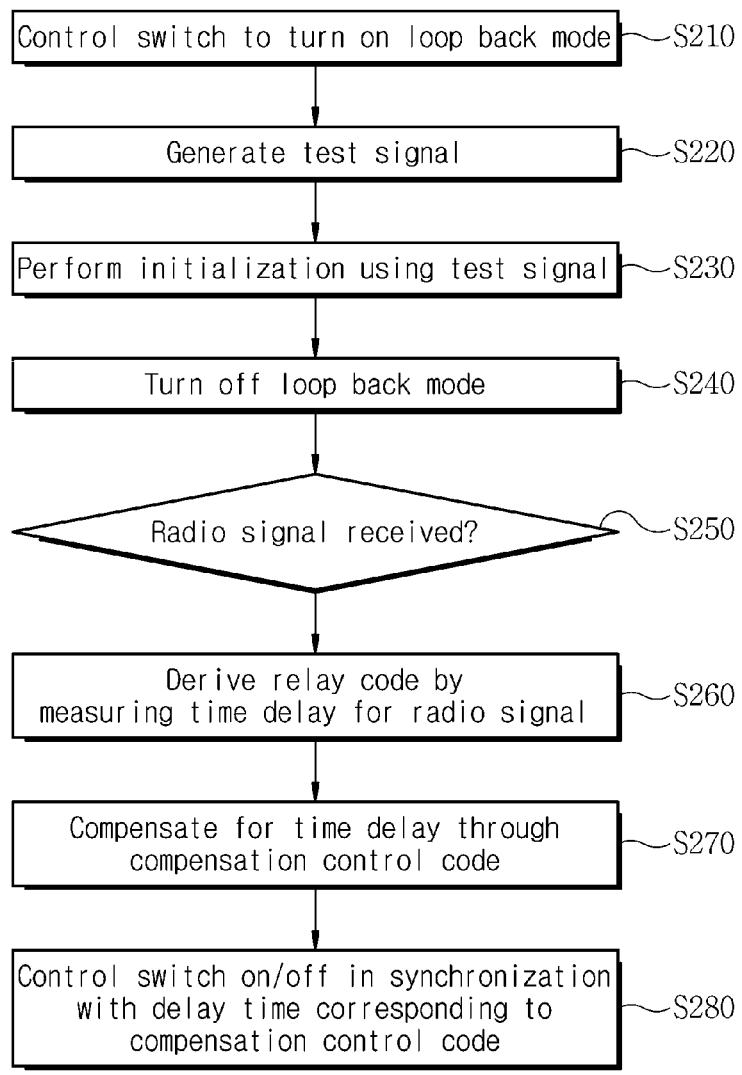
FIG. 9 is a flow diagram illustrating a method for time synchronization of a repeater according to an embodiment of the present disclosure.
Figure 10:
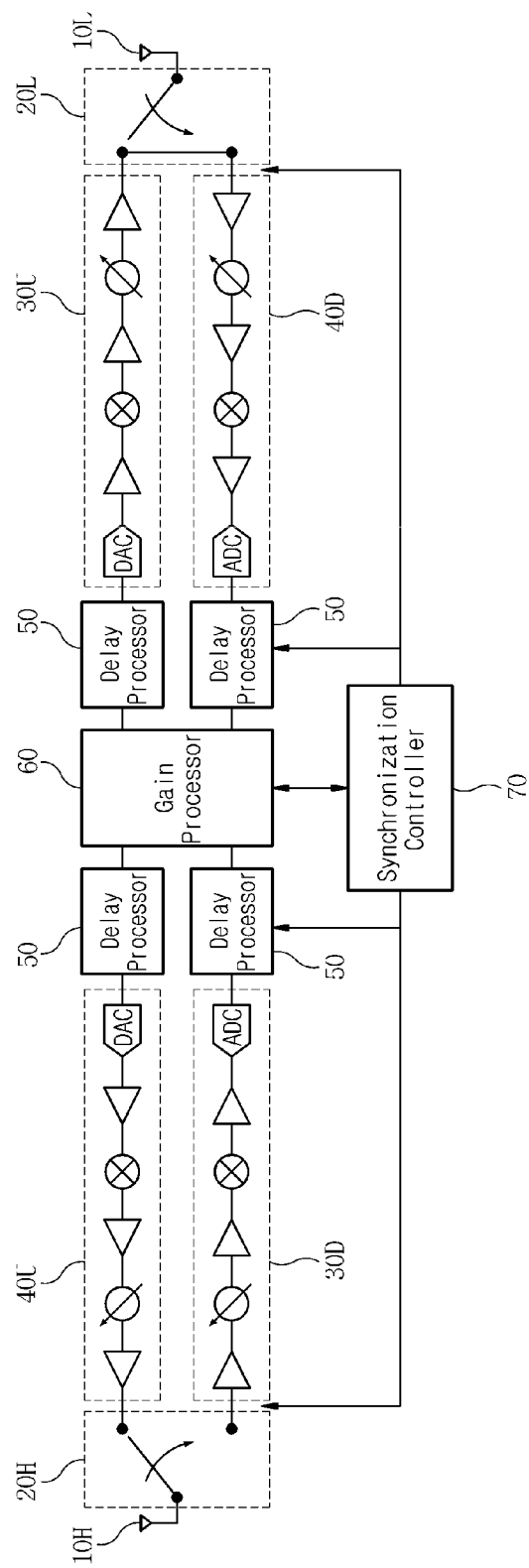
FIG. 10 is a diagram illustrating an initialization method for time synchronization of a repeater according to an embodiment of the present disclosure.

Next, a method for time synchronization of a repeater using the above-described delay processor 50 will be described. FIG. 9 is a flow diagram illustrating a method for time synchronization of a repeater according to an embodiment of the present disclosure. FIG. 10 is a diagram illustrating an initialization method for time synchronization of a repeater according to an embodiment of the present disclosure.

Referring to FIG. 9, at step S210, the synchronization controller 70 of the repeater switches the repeater to a loop back mode to initialize the delay processor 50 by controlling a switch including the upper switch 20H and the lower switch 20L. For example, in the loop back mode, the synchronization controller 70 may control the lower switch 20L so that the output of the downlink transmitter 40D is connected to the input of the uplink receiver 30U as shown in FIG. 10. Alternatively, in the loop back mode, the synchronization controller 70 may control the upper switch 20H so that the output of the uplink transmitter 40U is connected to the input to the downlink receiver 30D.

In this loop back mode, the gain processor 60 generates and transmits a test signal at step S220, and, the delay processor 50 performs initialization to calibrate each delay cell (DC) in the delay processor 50 by using the test signal at step S230.

For example, the test signal of the gain processor 60 is outputted through the downlink transmitter 40D according to the connection of the lower switch 20L and inputted to the uplink receiver 30U. Then, the test signal passes through processing of the uplink receiver 30U and is inputted to the delay buffer 500 of the delay processor 50. When the test signal is inputted to the delay buffer 500, the delay buffer 500 delays the input signal and then outputs it. The signal outputted from the delay buffer 500 is inputted to the frequency divider 100. Then, the frequency divider 100 makes the input signal D times slower and then outputs it. Therefore, the phase frequency detector 200 receives a system clock and a signal outputted from the frequency divider 100 and outputs a difference in frequency and period between the system clock and the output signal of the frequency divider 100. Then, the control code generator 300 generates an initialization control code capable of controlling a time delay of each delay cell (DC) in the delay buffer 500 so that the frequency and period of the output signal of the frequency divider 100 coincide with the frequency and period of the system clock. Then, the control code processor 400 stores the initialization control code generated by the control code generator 300.

Similarly, the test signal of the gain processor 60 is outputted through the uplink transmitter 40U according to the connection of the upper switch 20H and inputted to the downlink receiver 30D. Then, the test signal passes through processing of the downlink receiver 30D and is inputted to the delay buffer 500 of the delay processor 50. Thereafter, initialization can be performed as described above.

After initialization is completed, the synchronization controller 70 turns off the loop back mode by controlling the switches 20H and 20L at step S240.

Subsequently, at step S250, the repeater may receive a radio signal, that is, a downlink signal or an uplink signal, through the downlink receiver 30D or the uplink receiver 30U.

When a radio signal is received at step S250, the received radio signal is inputted to the delay processor 50 after being processed by the downlink receiver 30D or the uplink receiver 30U. Then, the delay processor 50 derives a delay code by measuring a time delay of the radio signal at step S260. Specifically, the step S260 will be described hereinafter. When a radio signal which is one of a downlink signal and an uplink signal is inputted to the delay buffer 500, each of a plurality of delay cells (DCs) in the delay buffer 500 delays the input signal according to the initialization control code and then outputs it. The output of each delay cell (DC) in the delay buffer 500 is inputted to a corresponding one of a plurality of measurement cells (MCs) in the delay measurer 600. Then, each measurement cell (MC) in the delay measurer 600 generates and outputs a delay code that indicates how much the output signal of each delay cell (DC) in the delay buffer 500 is delayed based on a rising edge of the system clock. The delay code processor 700 stores this delay code.

Subsequently, at step S270, the delay processor 50 generates a compensation control code based on the delay code, compensates for the time delay of the radio signal inputted to the delay buffer 500, and outputs it. Specifically, at step S270, the delay code processor 700 inputs the delay code to the control code generator 300. Then, the control code generator 300 generates the compensation control code by applying the inputted delay code as it is. This compensation control code is inputted to the delay buffer 500 by the control code processor 400. Then, the delay buffer 500 compensates for the time delay of the inputted radio signal according to the compensation control code and outputs it.

In addition, at step S280, the synchronization controller 70 performs a switching operation (ON/OFF) for distinguishing the uplink and downlink signal intervals in synchronization with the delay time corresponding to the compensation control code of the delay processor 50.

As described above, according to an embodiment of the present disclosure, by measuring and compensating for time delays of the downlink receiver 30D, the downlink transmitter 40D, the uplink receiver 30U, and the uplink transmitter 40U and then performing the switching to distinguish the uplink and downlink signals according to the compensated time delays, it is possible to eliminate the oscillation factor of the uplink and downlink.

The method according to an embodiment of the present disclosure may be provided in the form of a non-transitory computer-readable recording medium suitable for storing computer program instructions and data. The computer-readable recording medium may include program instructions, data files, data structures, etc. alone or in combination, and includes all kinds of recording devices in which data that can be read by a computer system is stored. The computer-readable recording medium includes a hardware device specially configured to store and execute program instructions, including magnetic media such as a hard disk, a floppy disk, and a magnetic tape, optical media such as a compact disc read only memory (CD-ROM) and a digital versatile disc (DVD), magneto-optical media such as a floptical disk, and semiconductor memories such as a read only memory (ROM), a random access memory (RAM), and a flash memory. Further, the computer-readable recording medium may be distributed over networked computer systems so that computer-readable code can be stored and executed in a distributed fashion. In addition, functional programs, associated codes, and code segments for implementing the present disclosure may be easily deduced or altered by programmers in the art to which the present disclosure belongs.

Until now, embodiments have been described and illustrated to illustrate the technical subject of the present disclosure, but the present disclosure is not limited to the configuration and operation of these embodiments, and a number of changes and modifications to the present disclosure are made without departing from the technical subject. It will be well understood by those skilled in the art that this is possible. Accordingly, all such appropriate changes and modifications and equivalents should be considered to be within the scope of the present disclosure.

According to an apparatus and method for time synchronization of a repeater in the present disclosure, through time synchronization of a repeater, it is possible to prevent oscillation due to positive feedback caused by overlap of an uplink signal and a downlink signal. This can optimize the time division duplexing (TDD) performance of the repeater. In particular, the present disclosure can be implemented through a relatively very simple digital logic circuit, so that the repeater can be drastically reduced in size while maintaining the overall performance. In addition, the present disclosure can accurately measure and compensate for a time delay without a high-speed clock, thereby reducing power consumption. Moreover, the present disclosure can measure and compensate for a time delay in real time, thereby maintaining optimal performance without being affected by environment such as temperature. The present disclosure has a good possibility of sales on the market or business and therefore has industrial applicability suitable for practical and apparent implementation.

What is claimed is:
1. An apparatus for time synchronization of a repeater, the apparatus comprising:
a downlink receiver and a downlink transmitter establishing a downlink path for delivering a downlink signal;

an uplink receiver and an uplink transmitter establishing an uplink path for delivering an uplink signal;
a switch including an upper switch and a lower switch and performing switching such that the downlink path is established in a downlink interval and the uplink path is established in an uplink interval;
a delay processor compensating for a time delay of one of the downlink signal and the uplink signal, the delay processor including:
  a delay buffer delaying an input signal in accordance with an initialization control code and outputting the delayed signal,
  a delay measurer generating a delay code indicating a time delay of the input signal by comparing an output of each delay cell with a system clock,
  a control code generator generating a compensation control code for compensating for the time delay of the signal in accordance with the delay code, and
  a control code processor inputting the generated compensation control code to the delay buffer so that the time delay of the signal is compensated by the delay buffer in accordance with the compensation control code; and
a synchronization controller controlling the switching of the switch in synchronization with the time delay of the compensated signal so that the uplink interval and the downlink interval do not overlap.

2. The apparatus of claim 1, wherein the delay buffer includes a plurality of delay cells connected in series, and
wherein each of the plurality of delay cells delays an input signal by same time and outputs the delayed signal.

3. The apparatus of claim 2, wherein the delay measurer includes a plurality of measurement cells corresponding to the plurality of delay cells, respectively, and generating the delay code by comparing an output of each of the plurality of delay cells with the system clock.

4. The apparatus of claim 1, further comprising:
a gain processor generating and transmitting a test signal in an initialization mode,
wherein when the synchronization controller controls the lower switch to connect the downlink transmitter and the uplink receiver and controls the upper switch to connect the uplink transmitter and the downlink receiver, the test signal is inputted to the delay processor through the downlink transmitter and the uplink receiver or is inputted to the delay processor through the uplink transmitter and the downlink receiver, and
wherein the delay processor performs initialization using the test signal.

5. The apparatus of claim 4, wherein the delay processor further includes:
a frequency divider, when the delay buffer delays an inputted test signal and outputs the delayed signal in the initialization mode, lowering a frequency of the signal outputted by the delay buffer by an integer multiple and outputting the frequency-lowered signal; and
a phase frequency detector measuring a frequency and period of the system clock and a frequency and period of the output signal of the frequency divider,
wherein the control code generator generates the initialization control code allowing the frequency and period of the output signal of the frequency divider to coincide with the frequency and period of the system clock, and
wherein the control code processor inputs the generated initialization control code to the delay buffer.

6. A method for time synchronization of a repeater, the method comprising:
when one of a downlink signal and an uplink signal is inputted, at a delay processor, deriving a delay code indicating a time delay of the input signal by measuring the time delay of the input signal;
at the delay processor, generating a compensation control code based on the delay code;
at the delay processor, compensating for the time delay of the signal by using the compensation control code, the compensating for the time delay of the signal including:
  delaying, by a delay buffer of the delay processor, an input signal in accordance with an initialization control code and outputting the delayed signal,
  generating, by a delay measurer of the delay processor, a delay code indicating a time delay of the input signal by comparing an output of each delay cell with a system clock,
  generating, by a control code generator of the delay processor, a compensation control code for compensating for the time delay of the signal in accordance with the delay code, and
  inputting, by a control code processor of the delay processor, the generated compensation control code to the delay buffer so that the time delay of the signal is compensated by the delay buffer in accordance with the compensation control code; and
at a synchronization controller, controlling switching of a switch selectively establishing a downlink path or an uplink path in synchronization with the time delay of the compensated signal so that an uplink interval and a downlink interval do not overlap.

7. The method of claim 6, wherein deriving the delay code includes:
at each of a plurality of delay cells connected in series in a delay buffer, delaying an input signal by same time and outputting the delayed signal; and
at each of a plurality of measurement cells in a delay measurer corresponding to each delay cell, deriving the delay code by comparing an output of each delay cell with a system clock.

8. The method of claim 6, wherein compensating for the time delay of the signal further includes:
at each of a plurality of delay cells in a delay buffer, compensating for the time delay of an input signal in accordance with the compensation control code and outputting the compensated signal.

9. The method of claim 6, further comprising:
before deriving the delay code,
at a synchronization controller, controlling a lower switch to connect a downlink transmitter and an uplink receiver, and controlling an upper switch to connect an uplink transmitter and a downlink receiver;
at a gain processor, generating a test signal, and inputting the test signal to the delay processor through the downlink transmitter and the uplink receiver, or inputting the test signal to the delay processor through the uplink transmitter and the downlink receiver; and
at the delay processor, performing initialization using the test signal.

10. The method of claim 9, wherein performing the initialization includes:
at a delay buffer, delaying an inputted test signal and outputting the delayed signal;
at a frequency divider, lowering a frequency of the outputted signal by an integer multiple and outputting the frequency-lowered signal;

a phase frequency detector, measuring a frequency and period of a system clock and a frequency and period of the output signal of the frequency divider; and at a control code generator, generates the initialization control code allowing the frequency and period of the output signal of the frequency divider to coincide with the frequency and period of the system clock.

\* \* \* \* \*